(12) United States Patent
Nagarajan

(10) Patent No.: US 9,245,815 B2
(45) Date of Patent: Jan. 26, 2016

(54) UNDERFILL MATERIAL INCLUDING BLOCK COPOLYMER TO TUNE COEFFICIENT OF THERMAL EXPANSION AND TENSILE MODULUS

(71) Applicant: INTEL CORPORATION, Santa Clara, CA (US)

(72) Inventor: Sivakumar Nagarajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/265,199

(22) Filed: Apr. 29, 2014

(65) Prior Publication Data

US 2015/0311134 A1  Oct. 29, 2015

(51) Int. Cl.

| | |
|---|---|
| *H01L 29/40* | (2006.01) |
| *H01L 23/48* | (2006.01) |
| *H01L 21/00* | (2006.01) |
| *H01L 23/29* | (2006.01) |
| *H01L 23/31* | (2006.01) |
| *H01L 23/00* | (2006.01) |
| *H01L 21/56* | (2006.01) |
| *C09J 163/00* | (2006.01) |
| *C09J 187/00* | (2006.01) |
| *C09J 153/00* | (2006.01) |

(52) U.S. Cl.
CPC .............. *H01L 23/295* (2013.01); *C09J 153/00* (2013.01); *C09J 163/00* (2013.01); *C09J 187/005* (2013.01); *H01L 21/563* (2013.01); *H01L 23/3142* (2013.01); *H01L 24/17* (2013.01); *H01L 24/81* (2013.01); *H01L 2224/16225* (2013.01); *H01L 2924/0665* (2013.01)

(58) Field of Classification Search
CPC ............ H01L 27/1255; H01L 27/1259; G09G 3/3677
USPC .............. 257/778, 738, 57, 59; 438/108, 123, 438/151, 155; 522/170
See application file for complete search history.

(56) References Cited

U.S. PATENT DOCUMENTS

| | | | | |
|---|---|---|---|---|
| 2002/0028533 | A1* | 3/2002 | Tang et al. ..................... | 438/106 |
| 2009/0082486 | A1* | 3/2009 | Bates et al. .................... | 522/170 |
| 2010/0197848 | A1* | 8/2010 | Verghese et al. .............. | 524/502 |
| 2011/0104498 | A1* | 5/2011 | Turakhia et al. ........... | 428/411.1 |
| 2011/0147912 | A1* | 6/2011 | Karpur et al. ................. | 257/687 |
| 2011/0319523 | A1* | 12/2011 | Ji et al. .......................... | 523/427 |
| 2012/0164791 | A1* | 6/2012 | Kim et al. ..................... | 438/118 |
| 2014/0343234 | A1* | 11/2014 | Karunakaran et al. ........ | 525/523 |

\* cited by examiner

*Primary Examiner* — Long K Tran
*Assistant Examiner* — Dzung Tran
(74) *Attorney, Agent, or Firm* — Schwabe, Williamson & Wyatt, P.C.

(57) ABSTRACT

Embodiments of the present disclosure are directed toward underfill material including block copolymer. In one embodiment, an underfill material includes epoxy material and a copolymer including an epoxy-philic block and an epoxy-phobic block, wherein the epoxy-philic block is miscible in the epoxy material, the epoxy-phobic block is covalently bonded with the epoxy-philic block, the epoxy-phobic block is separated in a microphase domain within the epoxy material and the epoxy-philic block is configured to restrict thermal expansion or contraction of the epoxy material.

5 Claims, 4 Drawing Sheets

UNDERFILL MATERIAL INCLUDING BLOCK COPOLYMER TO TUNE COEFFICIENT OF THERMAL EXPANSION AND TENSILE MODULUS

FIELD

Embodiments of the present disclosure generally relate to the field of materials for integrated circuit (IC) assemblies, and more particularly, to underfill material including block copolymer.

BACKGROUND

Currently, underfill material may be deposited between a die and substrate to promote adhesion between the die and substrate and/or to protect features of the die and substrate such as interconnect structures from environmental hazards. A coefficient of thermal expansion (CTE) of the underfill material may be designed to match, to the extent possible, a CTE of the die and/or substrate in order to reduce defects such as cracks, delamination, or other defects associated with thermal expansion or contraction of the die and/or substrate. Techniques are being investigated to reduce CTE of underfill material for some scenarios. For example, one technique includes adding inorganic fillers to reduce CTE of underfill materials. However, addition of inorganic fillers may also increase a viscosity of the underfill material, which may adversely affect processing of the underfill material. A higher viscosity may render the underfill material unsuitable for deposition in some cases.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
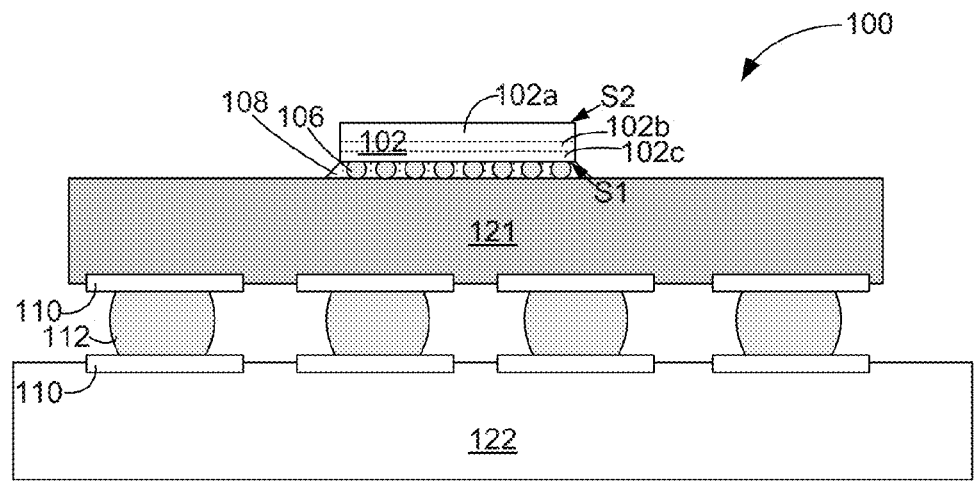
FIG. 1 schematically illustrates a cross-section side view of an example integrated circuit (IC) assembly, in accordance with some embodiments.

Embodiments of the present disclosure describe underfill material including block copolymer. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly 100, in accordance with some embodiments. In some embodiments, the IC assembly 100 may include one or more dies (hereinafter "die 102") electrically and/or physically coupled with a package substrate 121. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a processor, memory, SoC, or ASIC.

In some embodiments, an underfill material 108 (sometimes referred to as an "encapsulant") may be disposed between the die 102 and the package substrate 121 to promote adhesion and/or protect features of the die 102 and package substrate 121. The underfill material 108 may be composed of an electrically insulative material and may encapsulate at least a portion of the die 102 and/or die-level interconnect structures 106, as can be seen. In some embodiments, the underfill material 108 is in direct contact with the die-level interconnect structures 106. In some embodiments, the underfill material 108 may include a block copolymer as described further in connection with FIGS. 3-4 to reduce a coefficient of thermal expansion (CTE) and/or tensile modulus of the underfill material.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include transistor devices, and an inactive side, S2, may be disposed opposite to the active side S1, as can be seen.

The die 102 may generally include a semiconductor substrate 102a, one or more device layers (hereinafter "device layer 102b"), and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. In other embodiments, the package substrate 121 may be a circuit board such as, for example, a printed circuit board (PCB) formed using any suitable PCB technique. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias, or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 602 of FIG. 6).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

Figure 2:
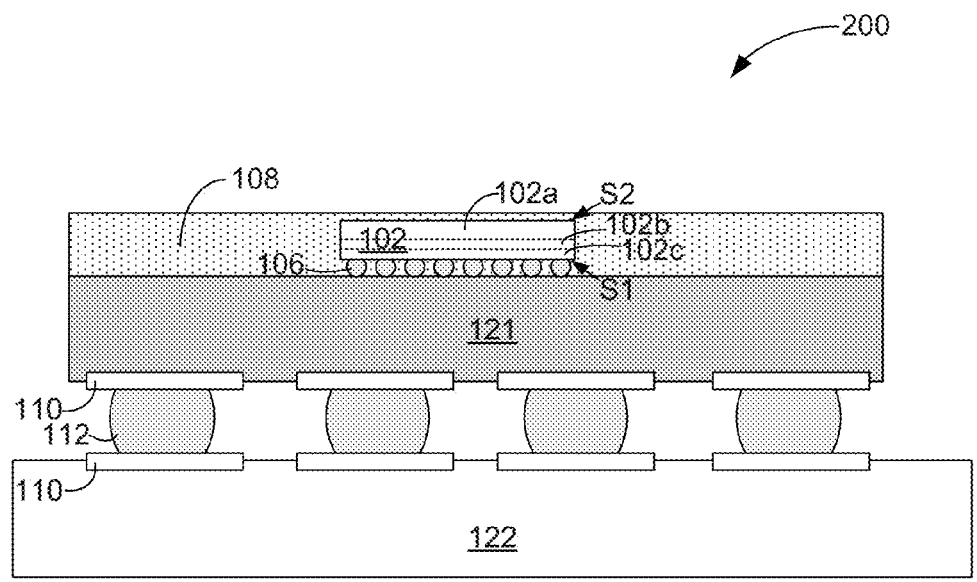
FIG. 2 schematically illustrates a cross-section side view of another example integrated circuit (IC) assembly, in accordance with some embodiments.

FIG. 2 schematically illustrates a cross-section side view of another example integrated circuit (IC) assembly 200, in accordance with some embodiments. The IC assembly 200 may generally comport with embodiments described in connection with IC assembly 100. In the IC assembly 200, the underfill material 108 is configured to encapsulate the die 102.

In the depicted embodiment, the underfill material 108 is disposed between the die 102 and the package substrate 121 and further configured to surround the die 102 in a molding compound configuration. In some embodiments, the underfill material 108 may encapsulate portions of the die between the active side S1 and inactive side S2 of the die 102 without being in direct contact with the inactive side S2 of the die 102. For example, in some embodiments, the underfill material 108 may be deposited or recessed such that the inactive side S2 of the die 102 is not encapsulated with the underfill material 108, but remains exposed. The underfill material 108 may be used to promote adhesion or to protect features of other suitable IC components in other configurations than depicted, in other embodiments.

Figure 3:
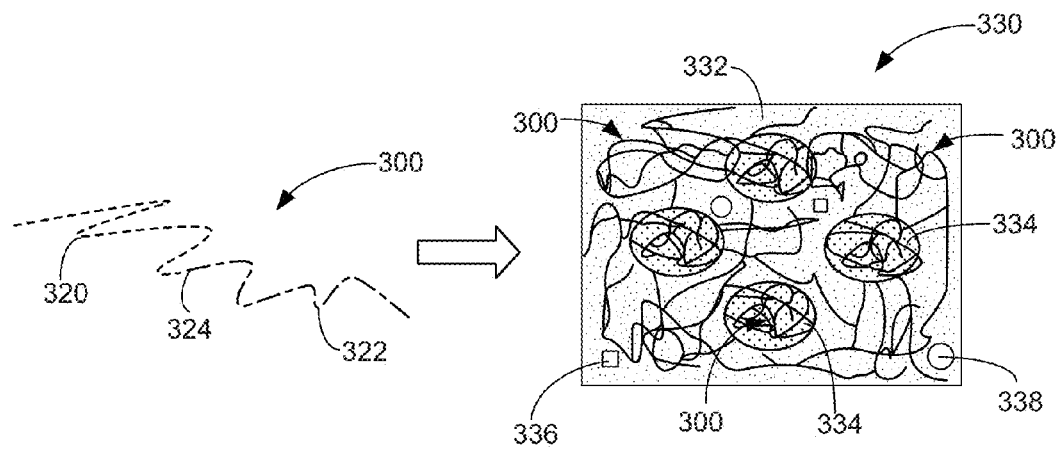
FIG. 3 schematically illustrates a block copolymer to reduce a coefficient of thermal expansion (CTE) of underfill material, in accordance with some embodiments.

FIG. 3 schematically illustrates a block copolymer 300 to reduce a coefficient of thermal expansion (CTE) of underfill material 330, in accordance with some embodiments. According to various embodiments, the block copolymer 300 includes an epoxy-philic block 320 and an epoxy-phobic block 322. In some embodiments, the epoxy-philic block 320 and the epoxy-phobic block 322 are coupled together by a covalent bond 324. Although the depicted block copolymer 300 is a diblock copolymer, in other embodiments, the block copolymer 300 may include more blocks.

The epoxy-philic block 320 may be more polar and hydrophilic than the epoxy-phobic block 322, which may render the epoxy-philic block 320 miscible in epoxy material 332 of the underfill material 330. Miscibility of the epoxy-philic block 320 in the epoxy material 332 may be based on a variety of factors including, for example, hydrophilicity, polarity and solubility parameter of the epoxy-philic block. In the present disclosure, being "miscible" may mean that the epoxy-philic block does not agglomerate into micro-phase domains in the epoxy material 332 subsequent to curing. The epoxy-phobic block 322 may be less polar (e.g., non-polar) and hydrophobic than the epoxy-philic block 320, which may render the epoxy-phobic block 322 less miscible or immiscible in the epoxy material 332 of the underfill material 330. The epoxy material 332 may be configured in an epoxy matrix.

The block copolymer 300 may be added to underfill material 330 to tune (e.g., reduce) the CTE of the underfill material 330 independent of filler content. Chemical incompatibility between the epoxy-philic block 320 and the epoxy-phobic block 322 may cause block copolymer 300 to separate into various geometries that may be governed by individual block length, proportions, and functionality. For example, in some embodiments, when the block copolymer 300 is mixed with the epoxy material 332 of the underfill material 330, the epoxy-phobic nature of the epoxy-phobic block 322 may cause the epoxy-phobic block 322 to separate and agglomerate into microphase domains 334 in the epoxy material 332 while still being chemically connected to the epoxy-philic block 320, which may be miscible in the epoxy material 332. The microphase domains 334 formed by the epoxy-phobic block 322 in the block copolymer 300 may act as pseudo-fillers and serve as anchoring points for the epoxy-philic block 320 portions that extend through the epoxy material 332 and restrict motion of the epoxy material 332. For example, the anchored epoxy-philic block 320 portions may restrict thermal expansion or contraction of the epoxy material 332. Such mechanism may reduce CTE of the underfill material 330.

According to various embodiments, the epoxy-philic block 320 may include one or more of poly(ethylene oxide) (PEO), poly(methyl methacrylate) (PMMA), poly(glycidyl methacrylate) (PGMA), poly(2-vinyl pyridine) (P2VP), poly(caprolactone) (PCL), and polyacrylic acid (PAA). Such example materials may be considered equivalents in some embodiments. Subject matter is not necessarily restricted to these examples and the epoxy-philic block 320 may include other suitable epoxy-philic materials in other embodiments.

According to various embodiments, the epoxy-phobic block 322 may include one or more of poly(ethylene-alt-propylene) (PEP), poly(nbutyl-acrylate) (PnBA), poly(styrene) (PS), polybutadiene (PBD), polypropylene oxide (PPO), polyethylene (PE), polyisoprene (PI), poly(butyleneoxide) (PBO), poly(hexylmethacrylate) (PHMA), and styrene-ethylene/butylene-styrene (SEBS). Such example materials may be considered equivalents in some embodiments. Subject matter is not necessarily restricted to these examples and the epoxy-phobic block 322 may include other suitable epoxy-phobic materials in other embodiments.

In some embodiments, the copolymer 300 may represent one or more of PEO-PEP, PEO-PEP-PEO, PEO-PS, PMMA-PS, P2VP-PS, PGMA-PHMA, or PS-PCL. Subject matter is not necessarily restricted to these examples and the copolymer may include other suitable copolymers in other embodiments. For example, in some embodiments, the copolymer 300 may include any suitable combination of the materials described above in connection with the epoxy-philic block 320 and the epoxy-phobic block 322.

According to various embodiments, the underfill material 330 may include other suitable materials such as, for example, a curing agent 336 (sometimes referred to as a "hardener"), inorganic filler 338 such as silica, coupling agents, adhesion promoters, flame retardants, reactive diluents, toughening agents and/or other well-known additive materials, which are not shown in the figures for the sake of clarity.

In some embodiments, the copolymer 300 may represent 50% by weight or less of the underfill material 330. In some embodiments, the copolymer 300 may represent 10% to 30% by weight of the underfill material 300. The addition of copolymer 300 may increase a viscosity of the underfill material 330, which may make some forms of deposition (e.g., capillary action) more difficult at higher viscosity prior to curing the underfill material 330. Other ranges of weight percentages may be used for the copolymer in the underfill material 330 in other embodiments.

In some embodiments, a CTE of the underfill material 330 may generally decrease with increasing amounts of copolymer 300 in the underfill material 330. In some embodiments, a tensile modulus may stay the same or decrease with increasing amounts of copolymer 300 in the underfill material 330, which may provide a mechanism to simultaneously decrease CTE and tensile modulus of the underfill material 330 to provide a low CTE and low tensile modulus underfill material.

For example, in some embodiments, the copolymer 300 may be used as partial replacement for inorganic fillers in the underfill material 330. Removing some amount of fillers may reduce viscosity and provide room for additional copolymer loading in the underfill material 330. Such approach may reduce CTE and, additionally, may help reduce tensile modulus (e.g., reduce stiffness) of the underfill material 330. Reduction in tensile modulus may be due to replacement of harder inorganic fillers with softer organic block copolymers.

Figure 4:
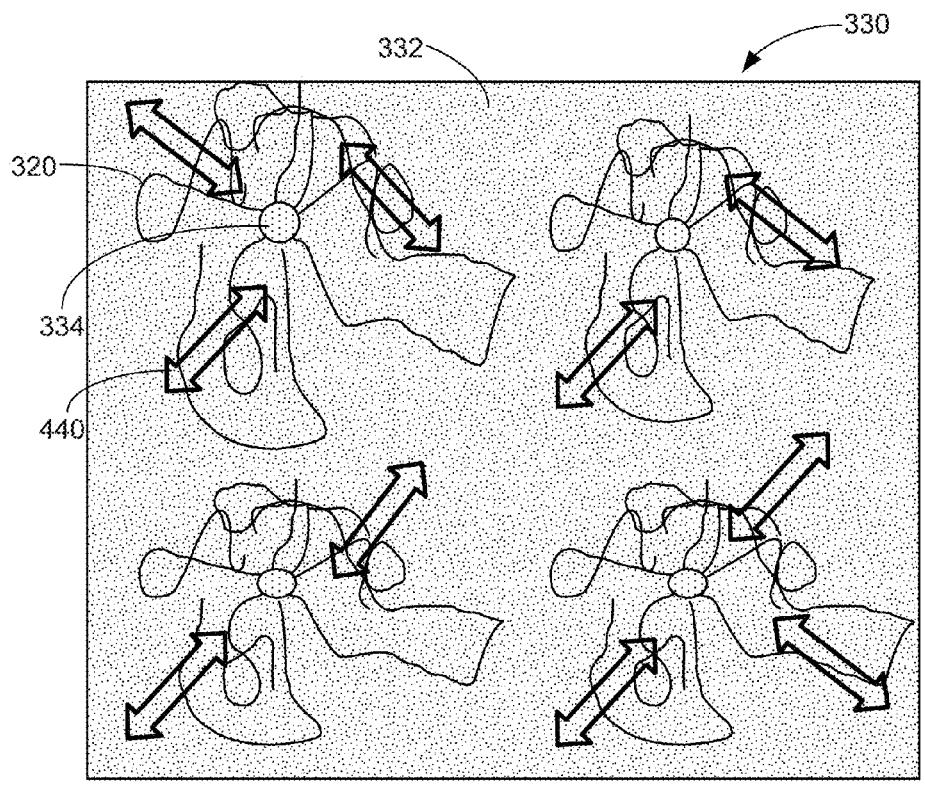
FIG. 4 schematically illustrates an underfill material including block copolymer to reduce a coefficient of thermal expansion (CTE) of the underfill material, in accordance with some embodiments.

FIG. 4 schematically illustrates an underfill material 330 including block copolymer (e.g., block copolymer 300 of FIG. 3) to reduce a coefficient of thermal expansion (CTE) of the underfill material 330, in accordance with some embodiments. Subsequent to curing, the block copolymer may separate into microphase domains 334 where the epoxy-phobic block of the block copolymer agglomerates or microphase separates. The epoxy-philic block 320 may extend into the epoxy material 332 and inhibit motion (e.g., indicated by arrows 440) of the underfill material 330 including, for example, thermal expansion or contraction.

Figure 5:
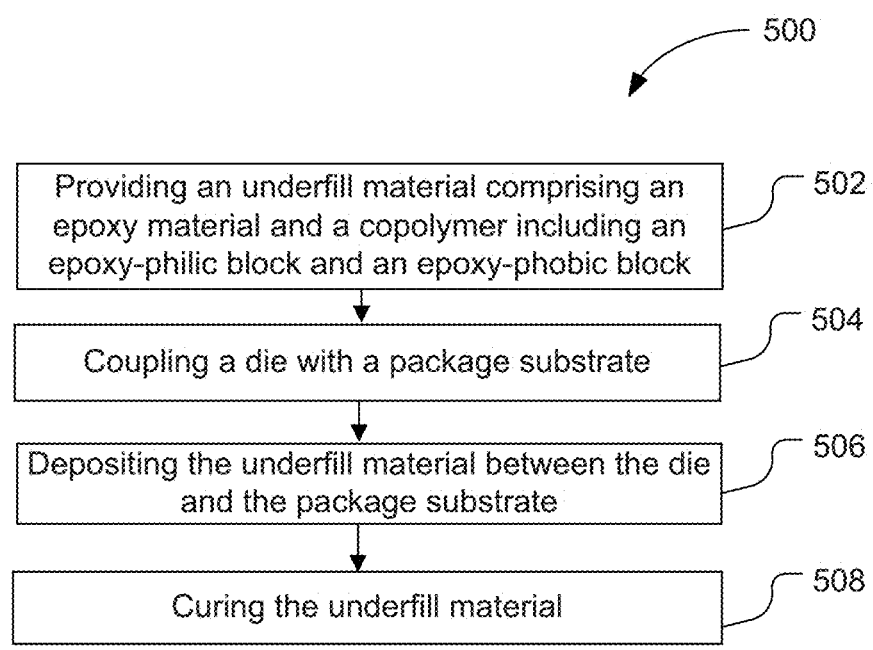
FIG. 5 schematically illustrates a flow diagram for a method of using underfill material, in accordance with some embodiments.

FIG. 5 schematically illustrates a flow diagram for a method 500 of using underfill material (e.g., underfill material 330 of FIGS. 3 and 4), in accordance with some embodiments. The method 500 may comport with embodiments described in connection with FIGS. 1-4 and vice versa.

At 502, the method 500 may include providing an underfill material (e.g., underfill material 330 of FIGS. 3-4) comprising an epoxy material (e.g., epoxy material 332 of FIGS. 3-4) and a copolymer (e.g., block copolymer 300 of FIGS. 3-4) including an epoxy-philic block (e.g., epoxy-philic block 320 of FIGS. 3-4) and an epoxy-phobic block (e.g., epoxy-phobic block 322 of FIGS. 3-4). In some embodiments, providing the underfill material may include adding the copolymer to the epoxy material.

At 504, the method 500 may include coupling a die (e.g., die 102 of FIGS. 1-2) with a package substrate (e.g., package substrate 121 of FIGS. 1-2). The die may be coupled according to a wide variety of suitable configurations including, for example, a flip-chip configuration as depicted in FIGS. 1-2. In some embodiments, multiple dies may be coupled with the package substrate.

At 506, the method 500 may include depositing the underfill material (e.g., the underfill material 108 of FIGS. 1-2) between the die and the package substrate. In some embodiments, depositing the underfill material may be performed such that the underfill material substantially or fully encapsulates the die.

At 508, the method 500 may include curing the underfill material. Curing the underfill material may be performed by heating the underfill material to promote hardening. In some embodiments, curing the underfill material may cause the copolymer to separate into microphase domains within the epoxy material such that the epoxy-philic block is configured to restrict thermal expansion or contraction of the epoxy material.

Various operations are described as multiple discrete operations in turn, in a manner that is most helpful in understanding the claimed subject matter. However, the order of description should not be construed as to imply that these operations are necessarily order dependent. For example, in some embodiments, coupling the die with the package substrate at 504 may be performed before, after or simultaneously with actions described in connection with 502. The method 500 may include other suitable variations of order.

Figure 6:
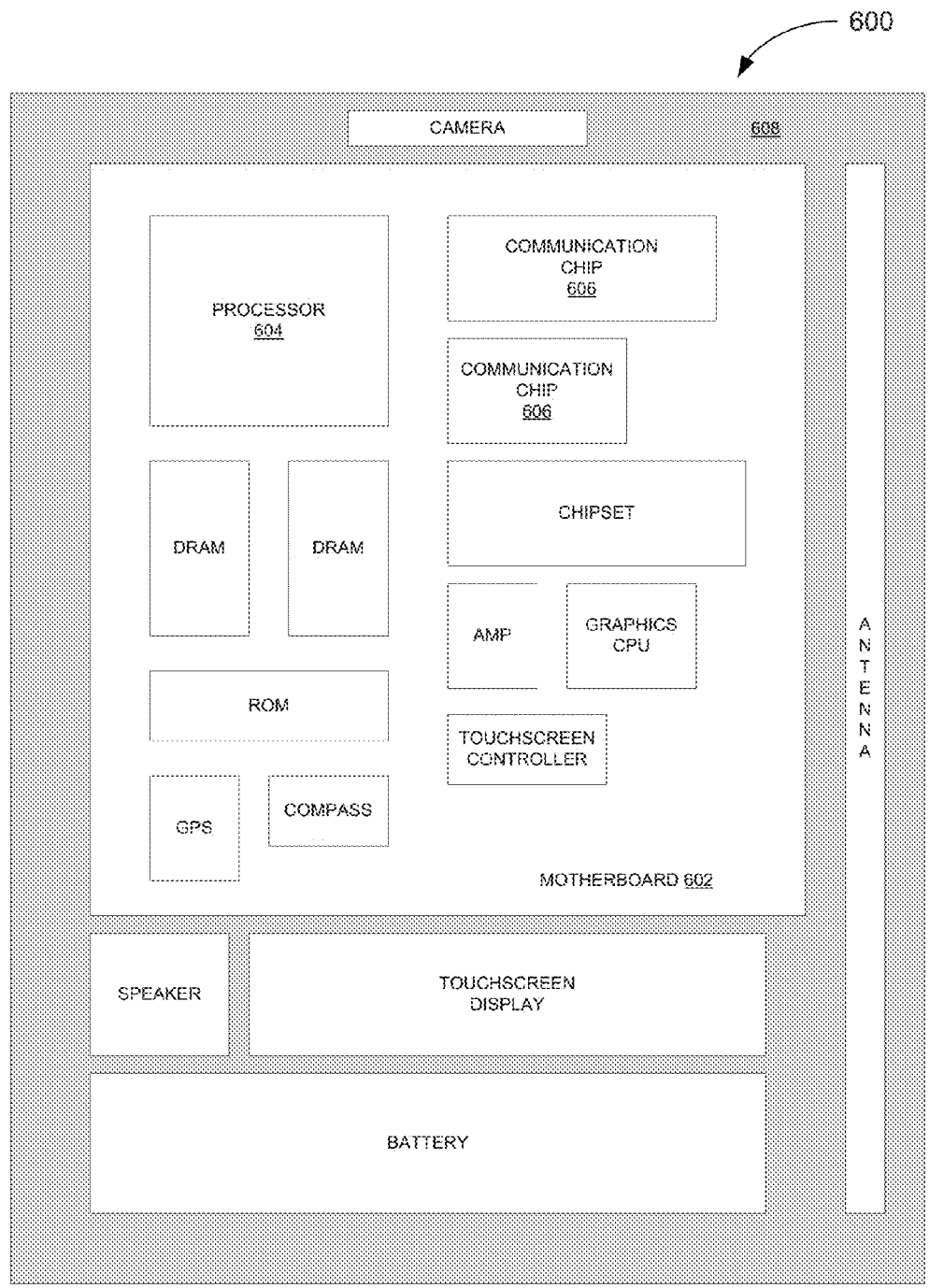
FIG. 6 schematically illustrates a computing device that includes an IC assembly as described herein, in accordance with some embodiments.

Embodiments of the present disclosure may be implemented into a system using any suitable hardware and/or software to configure as desired. FIG. 6 schematically illustrates a computing device 600 that includes an IC assembly (e.g., IC assembly 100 or 200 of FIG. 1 or 2) as described herein, in accordance with some embodiments. The computing device 600 may house a board such as motherboard 602 (e.g., in housing 608). The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, EV-DO, and others.

The processor 604 of the computing device 600 may be packaged in an IC assembly (e.g., IC assembly 100 or 200 of FIG. 1 or 2) including an underfill material (e.g., underfill material 330 of FIGS. 3-4) as described herein. For example, the circuit board 122 of FIG. 1 may be a motherboard 602 and the processor 604 may be a die 102 mounted on a package substrate 121 of FIG. 1. The package substrate 121 and the motherboard 602 may be coupled together using package-level interconnects such as solder balls 112. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 606 may also include a die that may be packaged in an IC assembly (e.g., IC assembly 100 or 200 of FIG. 1 or 2) including an underfill material (e.g., underfill material 330 of FIGS. 3-4) as described herein. In further implementations, another component (e.g., memory device or other integrated circuit device) housed within the computing device 600 may include a die that may be packaged in an IC assembly (e.g., IC assembly 100 or 200 of FIG. 1 or 2) including an underfill material (e.g., underfill material 330 of FIGS. 3-4) as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 600 may be a mobile computing device in some embodiments. In further implementations, the computing device 600 may be any other electronic device that processes data.

Examples

According to various embodiments, the present disclosure describes an underfill material. Example 1 of the underfill material comprises epoxy material and a copolymer including an epoxy-philic block and an epoxy-phobic block, wherein the epoxy-philic block is miscible in the epoxy material, the epoxy-phobic block is covalently bonded with the epoxy-philic block, the epoxy-phobic block is separated in a microphase domain within the epoxy material and the epoxy-philic block is configured to restrict thermal expansion or contraction of the epoxy material. Example 2 may include the underfill material of Example 1, wherein the epoxy-phobic block includes a material selected from the group consisting of poly(ethylene-alt-propylene) (PEP), poly(nbutyl-acrylate) (PnBA), poly(styrene) (PS), polybutadiene (PBD), polypropylene oxide (PPO), polyethylene (PE), polyisoprene (PI), poly(butyleneoxide) (PBO), poly(hexylmethacrylate) (PHMA), and styrene-ethylene/butylene-styrene (SEBS). Example 3 may include the underfill material of Example 2, wherein the epoxy-philic block includes a material selected from the group consisting of poly(ethylene oxide) (PEO), poly(methyl methacrylate) (PMMA), poly(glycidyl methacrylate) (PGMA), poly(2-vinyl pyridine) (P2VP), poly(caprolactone) (PCL), and polyacrylic acid (PAA). Example 4 may include the underfill material of Example 3, wherein the copolymer comprises one of PEO-PEP, PEO-PEP-PEO, PEO-PS, PMMA-PS, P2VP-PS, PGMA-PHMA, or PS-PCL. Example 5 may include the underfill material of any of Examples 1-4, further comprising inorganic filler. Example 6 may include the underfill material of any of Examples 1-4, further comprising a curing agent. Example 7 may include the underfill material of any of Examples 1-4, wherein the copolymer is 50% by weight or less of the underfill material and the copolymer is configured to reduce a tensile modulus of the underfill material.

According to various embodiments, the present disclosure may describe an integrated circuit (IC) assembly. Example 8 of the IC assembly may comprise a package substrate a die coupled with the package substrate and an underfill material disposed between the die and the package substrate, the underfill material including epoxy material, and a copolymer including an epoxy-philic block and an epoxy-phobic block, wherein the epoxy-philic block is miscible in the epoxy material, the epoxy-phobic block is covalently bonded with the epoxy-philic block, the epoxy-phobic block is separated in a microphase domain within the epoxy material and the epoxy-philic block is configured to restrict thermal expansion or contraction of the epoxy material. Example 9 may include the IC assembly of Example 8, wherein the package substrate is an epoxy-based laminate package substrate. Example 10 may include the IC assembly of Example 8, wherein the die is coupled with the substrate using one or more die-level interconnect structures and the underfill material is in direct contact with the one or more die-level interconnect structures. Example 11 may include the IC assembly of Example 8, wherein the underfill material encapsulates the die. Example 12 may include the IC assembly of any of Examples 8-11, wherein the epoxy-phobic block includes a material selected from the group consisting of poly(ethylene-alt-propylene) (PEP), poly(nbutyl-acrylate) (PnBA), poly(styrene) (PS), polybutadiene (PBD), polypropylene oxide (PPO), polyethylene (PE), polyisoprene (PI), poly(butyleneoxide) (PBO), poly(hexylmethacrylate) (PHMA), and styrene-ethylene/butylene-styrene (SEBS). Example 13 may include the IC assembly of any of Examples 8-11, wherein the epoxy-philic block includes a material selected from the group consisting of poly(ethylene oxide) (PEO), poly(methyl methacrylate) (PMMA), poly(glycidyl methacrylate) (PGMA), poly(2-vinyl pyridine) (P2VP), poly(caprolactone) (PCL), and polyacrylic acid (PAA). Example 14 may include the IC assembly of any of Examples 8-11, wherein the copolymer is configured to reduce a tensile modulus of the underfill material.

According to various embodiments, the present disclosure may describe a method of using underfill material. Example 15 of a method may comprise providing an underfill material including epoxy material, and a copolymer including an epoxy-philic block and an epoxy-phobic block, wherein the epoxy-philic block is miscible in the epoxy material and the epoxy-phobic block is covalently bonded with the epoxy-philic block, depositing the underfill material between a package substrate and a die coupled with the package substrate and curing the underfill material, wherein the epoxy-phobic block is separated in a microphase domain within the epoxy material and the epoxy-philic block is configured to restrict thermal expansion or contraction of the epoxy material. Example 16 may include the method of Example 15, wherein depositing the underfill material further comprises depositing the underfill material to substantially encapsulate the die. Example 17 may include the method of Example 15, wherein providing the underfill material comprises providing the epoxy-phobic block of the copolymer, the epoxy-phobic block including a material selected from the group consisting of poly(ethylene-alt-propylene) (PEP), poly(nbutyl-acrylate) (PnBA), poly(styrene) (PS), polybutadiene (PBD), polypropylene oxide (PPO), polyethylene (PE), polyisoprene (PI), poly(butyleneoxide) (PBO), poly(hexylmethacrylate) (PHMA), and styrene-ethylene/butylene-styrene (SEBS) and providing the epoxy-philic block of the copolymer, the epoxy-philic block including a material selected from the group consisting of poly(ethylene oxide) (PEO), poly(methyl methacrylate) (PMMA), poly(glycidyl methacrylate) (PGMA), poly(2-vinyl pyridine) (P2VP), poly(caprolactone) (PCL), and polyacrylic acid (PAA). Example 18 may include the method of Example 17, wherein providing the underfill material comprises providing the copolymer, the copolymer including a material selected from the group consisting of PEO-PEP, PEO-PEP-PEO, PEO-PS, PMMA-PS, P2VP-PS, PGMA-PHMA, and PS-PCL. Example 19 may include the method of any of Examples 15-18, further comprising coupling the die with the package substrate. Example 20 may include the method of Example 19, wherein coupling the die with the package substrate is performed using one or more die-level interconnect structures and the underfill material is in direct contact with the one or more die-level interconnect structures subsequent to depositing the underfill material.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An underfill material comprising:
   epoxy material; and
   a copolymer including an epoxy-philic block and an epoxy-phobic block, wherein the epoxy-philic block is miscible in the epoxy material, the epoxy-phobic block is covalently bonded with the epoxy-philic block, the epoxy-phobic block is separated in a microphase domain within the epoxy material and the epoxy-philic block is configured to restrict thermal expansion or contraction of the epoxy material wherein the copolymer is comprised of the epoxy-philic block and the epoxy-phobic block selected from one of each group consisting of (a) the epoxy-philic block is polyethylene oxide (PEO) and the epoxy-phobic block is selected from the group consisting of poly(nbutyl-acrylate) (PnBA), poly(styrene) (PS), polypropylene oxide (PPO), polyethylene (PE), poly(hexylmethacrylate) (PHMA), and styrene-ethylene/butylene-styrene (SEBS), (b) the epoxy-philic block is polymethyl methacrylate (PMMA) and the epoxy-phobic block is selected from the group consisting of PEP, PnBA, PS, PBD, PPO, PE, poly(butyleneoxide) (PBO), PHMA, and SEBS, (c) the epoxy-philic block is poly(glycidyl methacrylate) (PGMA) and the epoxy-phobic block is selected from the group consisting of PEP, PnBA, PS, PBD, PPO, PE, polyisoprene (PI), PBO, PHMA, and SEBS, (d) the epoxy-philic block is poly(2-vinyl pyridine) (P2VP) and the epoxy-phobic block is selected from the group consisting of PEP, PnBA, PS, PBD, PPO, PE, PI, PBO, PHMA, and SEBS, (e) the epoxy-philic block is poly(caprolactone) (PCL) and the epoxy-phobic block is selected from the group consisting of PEP, PnBA, PS, PBD, PPO, PE, PI, PBO, PHMA, and SEBS, or (f) the epoxy-philic block is polyacrylic acid (PAA) and the epoxy-phobic block is selected from the group consisting of PEP, PnBA, PS, PBD, PPO, PE, PI, PBO, PHMA, and SEBS.

2. The underfill material of claim 1, wherein the copolymer comprises one of PEO-PEP-PEO, PEO-PS, PMMA-PS, P2VP-PS, PGMA-PHMA, or PS-PCL.

3. The underfill material of claim 1, further comprising:
   inorganic filler.

4. The underfill material of claim 1, further comprising:
   a curing agent.

5. The underfill material of claim 1, wherein the copolymer is configured to reduce a tensile modulus of the underfill material.

* * * * *